(12) United States Patent
Mizushima

(10) Patent No.: US 11,152,224 B2
(45) Date of Patent: Oct. 19, 2021

(54) SEMICONDUCTOR DEVICE WITH FIELD STOP LAYER AND SEMICONDUCTOR DEVICE MANUFACTURING METHOD THEREOF

(71) Applicant: FUJI ELECTRIC CO., LTD., Kawasaki (JP)

(72) Inventor: Tomonori Mizushima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 49 days.

(21) Appl. No.: 14/372,454

(22) PCT Filed: Mar. 15, 2013

(86) PCT No.: PCT/JP2013/057562
§ 371 (c)(1),
(2) Date: Jul. 16, 2014

(87) PCT Pub. No.: WO2013/141181
PCT Pub. Date: Sep. 26, 2013

(65) Prior Publication Data
US 2015/0069462 A1     Mar. 12, 2015

(30) Foreign Application Priority Data

Mar. 23, 2012   (JP) .............................. JP2012-067535

(51) Int. Cl.
*H01L 21/322*     (2006.01)
*H01L 29/66*     (2006.01)
(Continued)

(52) U.S. Cl.
CPC ...... *H01L 21/3223* (2013.01); *H01L 21/2636* (2013.01); *H01L 21/304* (2013.01);
(Continued)

(58) Field of Classification Search
CPC ..... H01L 29/7397; H01L 29/32; H01L 29/36; H01L 29/7395; H01L 29/0834;
(Continued)

(56) References Cited

U.S. PATENT DOCUMENTS 6,384,431 B1 *   5/2002   Takahashi ........... H01L 29/1095
                                                     257/147
6,482,681 B1 *  11/2002   Francis ............. H01L 21/26506
                                                     438/138
(Continued)

FOREIGN PATENT DOCUMENTS

JP   2001-160559 A    6/2001
JP   2003-533047 A   11/2003
(Continued)

OTHER PUBLICATIONS

Office Action with partial English Translation dated Jan. 27, 2015 by Japan Patent Office for corresponding Japanese application No. 2014-506210.
(Continued)

*Primary Examiner* — David Chen
(74) *Attorney, Agent, or Firm* — Rabin & Berdo, P.C.

(57) ABSTRACT

First and second n-type field stop layers in an n⁻ drift region come into contact with a p⁺ collector layer. The first n-type field stop layer has an impurity concentration reduced toward an n⁺ emitter region at a steep gradient. The second n-type field stop layer has an impurity concentration distribution in which impurity concentration is reduced toward the n⁺ emitter region at a gentler gradient than that in the first n-type field stop layer and the impurity concentration of a peak position is less than that in the impurity concentration distribution of the first n-type field stop layer. The impurity concentration distributions of the first and second n-type field stop layers have the same peak position. The first and second n-type field stop layers are formed using annealing
(Continued)

and first and second proton irradiation processes which have the same projected range and different acceleration energy levels.

9 Claims, 12 Drawing Sheets

(51) Int. Cl.
 *H01L 29/739* (2006.01)
 *H01L 29/06* (2006.01)
 *H01L 29/861* (2006.01)
 *H01L 29/36* (2006.01)
 *H01L 29/08* (2006.01)
 *H01L 21/263* (2006.01)
 *H01L 21/304* (2006.01)
 *H01L 21/324* (2006.01)

(52) U.S. Cl.
 CPC ........ *H01L 21/324* (2013.01); *H01L 29/0619* (2013.01); *H01L 29/0834* (2013.01); *H01L 29/36* (2013.01); *H01L 29/66333* (2013.01); *H01L 29/7395* (2013.01); *H01L 29/8611* (2013.01)

(58) Field of Classification Search
 CPC ........... H01L 29/66333; H01L 29/1095; H01L 21/3223; H01L 21/304; H01L 21/324; H01L 29/0619
 USPC ................. 257/139, 655, E21.383, E29.198
 See application file for complete search history.

(56) References Cited

U.S. PATENT DOCUMENTS

| 2002/0117712 A1* | 8/2002 | Matsudai .......... H01L 29/66333 |
| | | 257/330 |
| 2002/0190281 A1 | 12/2002 | Francis et al. |
| 2003/0211693 A1 | 11/2003 | Takei et al. |
| 2006/0035436 A1 | 2/2006 | Schulze |
| 2006/0073684 A1* | 4/2006 | Schulze ................ H01L 21/263 |
| | | 438/514 |
| 2008/0054369 A1 | 3/2008 | Schulze et al. |
| 2008/0315364 A1 | 12/2008 | Nemoto |
| 2010/0244093 A1 | 9/2010 | Rahimo et al. |
| 2012/0267681 A1 | 10/2012 | Nemoto et al. |
| 2013/0075783 A1 | 3/2013 | Yamazaki et al. |
| 2014/0070268 A1 | 3/2014 | Yoshinnura et al. |

FOREIGN PATENT DOCUMENTS

| JP | 2007-266233 A | 10/2007 |
| JP | 2010-541266 A | 12/2010 |
| JP | 2011-187753 A | 9/2011 |
| JP | 2013-074181 A | 4/2013 |
| WO | WO 01-086712 A1 | 11/2001 |
| WO | WO-2007-055352 A1 | 5/2007 |
| WO | WO-2011/052787 A1 | 5/2011 |

OTHER PUBLICATIONS

Extended European Search Report dated May 26, 2015.

* cited by examiner

RELATED ART

SEMICONDUCTOR DEVICE WITH FIELD STOP LAYER AND SEMICONDUCTOR DEVICE MANUFACTURING METHOD THEREOF

TECHNICAL FIELD

The present invention relates to a semiconductor device and a semiconductor device manufacturing method.

BACKGROUND ART

For example, an insulated gate bipolar transistor (IGBT) or a diode which has a breakdown voltage of 600 V, 1200 V, or more has been known as a power semiconductor device. The power semiconductor device is used in a power conversion device, such as a converter or an inverter, and requires low loss and high efficiency. Therefore, a device provided with a field stop (FS) layer is generally used as the power semiconductor device.

An FS-IGBT will be described as an example of the device provided with the field stop (FS) layer. FIG. 11 is a cross-sectional view illustrating the cross-sectional structure of a semiconductor device according to the related art. As illustrated in FIG. 11, in an FS-IGBT, in an active region 100a in which a current flows when the FS-IGBT is turned on, a MOS (metal-oxide-semiconductor insulated gate) structure including a p base region 102, an $n^+$ emitter region 103, a gate oxide film 104, and a gate electrode 105 is provided on the front surface of a semiconductor substrate which will be an $n^-$ drift region 101. An emitter electrode 106 comes into contact with the p base region 102 and the $n^+$ emitter region 103. The emitter electrode 106 is electrically insulated from the gate electrode 105 by an interlayer insulating film 107.

In an edge termination structure region 100b which reduces the electric field on the front surface side of the $n^-$ drift region 101 and holds a breakdown voltage, a field limiting ring (FLR) 111, which is a floating p-type region, and a field plate (FP: Field Plate) 112 which is connected to the FLR 111 are provided on the front surface side of the semiconductor substrate. In addition, a $p^+$ collector layer 108 is provided in a surface layer of the rear surface of the semiconductor substrate. A collector electrode 109 comes into contact with the $p^+$ collector layer 108. An n-type field stop layer 110 which has a higher impurity concentration than that of the $n^-$ drift region 101 is provided between the $n^-$ drift region 101 and the $p^+$ collector layer 108.

When the pn junction between the $n^-$ drift region 101 and the p base region 102 is reverse-biased, the n-type field stop layer 110 prevents a depletion layer which is spread from the pn junction from reaching the $p^+$ collector layer 108. The breakdown voltage of the device can be determined by the impurity concentration or thickness of the n-type field stop layer 110. In addition, the impurity concentration of the $n^-$ drift region 101 and the impurity concentration and thickness of the n-type field stop layer 110 can be appropriately set to reduce the thickness of the $n^-$ drift region 101. Therefore, the trade-off between a reduction in on-voltage and a reduction in loss is improved.

First, in a step of forming the n-type field stop layer 110 according to the related art, after a semiconductor wafer is completed, the FS-IGBT is thinned to a desired thickness. Then, an n-type dopant, such as phosphorus or selenium, is implanted into the rear surface of the semiconductor wafer and annealing is performed at a high temperature of, for example, 600° C. or higher to activate the n-type dopant implanted into the rear surface of the semiconductor wafer. Then, the n-type field stop layer 110 is formed in the surface layer of the rear surface of the semiconductor wafer. Then, the $p^+$ collector layer 108 which is shallower than the n-type field stop layer 110 is formed in a surface layer of the n-type field stop layer 110.

However, when the n-type field stop layer 110 is formed in this way, a step of forming a front surface electrode or a passivation film, which is likely to have problems caused by high-temperature annealing, needs to be performed after the n-type field stop layer 110 is formed since high-temperature annealing is performed in order to form the n-type field stop layer 110. Therefore, the front surface electrode or the passivation film is formed on the thin semiconductor wafer after a thinning process and the number of steps performed for the thin semiconductor wafer increases. As a result, the process load applied to the semiconductor wafer increases and yield is reduced.

As a method for solving the problems, for example, the following method has been known: protons ($H^+$) are radiated to the rear surface of a semiconductor wafer; an annealing process is performed such that the radiated and injected hydrogen atom and a peripheral vacancy form a composite defect; and an n-type field stop layer is formed using a hydrogen-related donor obtained by changing the composite defect into a donor. It is possible to easily increase the projected range of the proton, as compared to, for example, phosphorus (P) or selenium (Se). Therefore, it is possible to radiate the proton at a desired depth even in a thick semiconductor wafer before the thinning process. In addition, the annealing temperature required to change the proton to a donor is in the range of, for example, about 300° C. to 500° C. and is lower than the annealing temperature required to activate, for example, phosphorus or selenium. Therefore, after the front surface electrode or the passivation film is formed, it is possible to form a donor layer using protons as the n-type field stop layer and to reduce the process load applied to the semiconductor wafer.

The following method has been proposed as the semiconductor device manufacturing method for forming the n-type field stop layer using proton irradiation and low-temperature annealing. The method includes a step of forming an element active region and an emitter electrode on the front surface side of an inexpensive FZ wafer, grinding the rear surface of the wafer to a predetermined thickness, radiating protons to the rear surface, and performing a low-temperature annealing process to form an $n^+$ buffer layer and a step of radiating a boron ion beam to the rear surface, and performing an annealing process for radiating light or a laser beam to the rear surface of the wafer while cooling the surface of the wafer to form a $p^+$ collector layer. An n-type defect layer including lattice defects can be formed by the proton irradiation process and the low-temperature annealing process. The n-type defect layer substantially functions as an $n^+$ buffer layer (for example, see the following Patent Document 1).

As another method, an IGBT manufacturing method has been proposed which manufactures a punch-through IGBT in an N-type float zone silicon wafer. The IGBT manufacturing method includes: a step of forming the uppermost structure including a plurality of base regions, a source region, a gate lattice, and an emitter electrode on the uppermost surface of the wafer; a step of removing float zone silicon from the bottom of the wafer to reduce the thickness of the wafer to a predetermined value; a step of implanting hydrogen ions into the bottom of the wafer at a predetermined depth and concentration to form an $n^+$ buffer layer; a step of forming a P⁻ collector region in the bottom of the n⁺ buffer layer; a step of forming a rear contact on the P⁻ collector region; a step of increasing the temperature to a value at which the uppermost structure of the wafer is not damaged and performing annealing after the hydrogen ions are implanted. The hydrogen ions are implanted in a plurality of continuous individual steps in which the amount of hydrogen ions implanted is gradually reduced and energy is gradually increased (for example, see the following Patent Document 2).

As another method, the following method has been proposed. After oxygen is introduced into an N⁻ FZ wafer, which will be a first N⁻ semiconductor layer, a second P-type semiconductor layer and an anode electrode are formed on the surface of the FZ wafer. Protons are radiated to the FZ wafer from the anode electrode to introduce crystal defects into the FZ wafer. A heat treatment is performed to recover the crystal defects in the FZ wafer. Then, the net doping concentration of a portion of the first semiconductor layer is higher than the initial net doping concentration of the FZ wafer. In this way, a desired broad buffer structure is formed (for example, see the following Patent Document 3).

CITATION LIST

Patent Document

Patent Document 1: JP 2001-160559 A
Patent Document 2: JP 2003-533047 W
Patent Document 3: JP 2007-055352 W However, when the defects formed by the proton irradiation are changed to donors to form the field stop layer as in Patent Document 1 to Patent Document 3, the number of detects increases as the impurity concentration of the field stop layer increases, which results in a reduction in the lifetime of the drift region. Therefore, the IGBT has the problems that the amount of carriers injected from the collector is reduced and an on-voltage Von increases; the switching speed increases when the IGBT is turned off; or the depletion layer reaches the field stop layer during switching, which results in an increase in leakage current. The diode has the problem that hard recovery occurs during reverse recovery and a surge voltage increases.

In Patent Document 1, since the acceleration energy of the proton irradiation is equal to or less than 1 MeV, the half width of the field stop layer is equal to or less than 10 μm and it is difficult to smoothly suppress the expansion of the depletion layer during switching, which may cause oscillation (noise). In Patent Document 2, a plurality of proton irradiation processes are performed at an acceleration energy of 500 keV or more to form a plurality of field stop layers. However, since the half width of each field stop layer is narrow, it is difficult to smoothly suppress the expansion of the depletion layer during switching.

In order to solve the above-mentioned problems of the related art and an object of the invention is to provide a semiconductor device and a semiconductor device manufacturing method which can reduce a leakage current. In addition, in order to solve the above-mentioned problems of the related art, an object of the invention is to provide a semiconductor device with a high breakdown voltage and a method for manufacturing the semiconductor device.

SUMMARY

In order to solve the above-mentioned problems and achieve the objects of the invention, a semiconductor device manufacturing method according to an aspect of the invention has the following characteristics. An irradiation step of performing two or more proton irradiation processes which have the same projected range and different acceleration energy levels for a rear surface of a semiconductor substrate of a first conductivity type is performed. Then, an annealing step of activating a proton radiated in the irradiation step using annealing to form two or more first-conductivity-type semiconductor layers with a higher impurity concentration than that of the semiconductor substrate in a surface layer of the rear surface of the semiconductor substrate is performed. Then, a contact forming step of forming a contact layer, which is a contact portion with an output electrode, in the surface layer of the rear surface of the semiconductor substrate is performed after the annealing step. Then, an output electrode forming step of forming the output electrode that comes into contact with the contact layer is performed. In the irradiation step, the projected range of each of the two or more proton irradiation processes is adjusted such that the surface layer of the rear surface of the semiconductor substrate is disposed in the two or more first-conductivity-type semiconductor layers in a depth direction of the semiconductor substrate.

In the semiconductor device manufacturing method according to the above-mentioned aspect of the invention, in the irradiation step, absorbers with different thicknesses may be used and the projected range of each of the two or more proton irradiation processes may be adjusted by a combination of the different acceleration energy levels and the thicknesses of the absorbers.

In the semiconductor device manufacturing method according to the above-mentioned aspect of the invention, in the irradiation step, the two or more proton irradiation processes may be performed at different acceleration energy levels in the range of 1 MeV to 20 MeV.

In the semiconductor device manufacturing method according to the above-mentioned aspect of the invention, the annealing step may be performed after at least the last proton irradiation process.

In the semiconductor device manufacturing method according to the above-mentioned aspect of the invention, in the annealing step, the annealing may be performed at a temperature of 300° C. to 500° C.

In the semiconductor device manufacturing method according to the above-mentioned aspect of the invention, in the annealing step, the annealing may be performed for 1 to 10 hours.

The semiconductor device manufacturing method according to the above-mentioned aspect of the invention may further include a front surface element structure forming step of forming a front surface element structure on a front surface of the semiconductor substrate before the irradiation step. In the front surface element structure forming step, an insulated gate structure of an insulated gate bipolar transistor which forms a first-conductivity-type channel may be formed on the front surface of the semiconductor substrate. In the contact forming step, a collector layer of a second conductivity type may be formed as the contact layer.

The semiconductor device manufacturing method according to the above-mentioned aspect of the invention may further include a front surface element structure forming step of forming a front surface element structure on a front surface of the semiconductor substrate before the irradiation step. In the front surface element structure forming step, an anode region of a second conductivity type may be formed in a surface layer of the front surface of the semiconductor substrate. In the contact forming step, a cathode layer of the first conductivity type may be formed as the contact layer.

In order to solve the above-mentioned problems and achieve the objects of the invention, a semiconductor device according to another aspect of the invention has the following characteristics. A first semiconductor layer is provided in a surface layer of a rear surface of a semiconductor substrate of a first conductivity type. A second semiconductor layer of the first conductivity type is provided in the semiconductor substrate so as to come into contact with the first semiconductor layer. The second semiconductor layer has a higher impurity concentration than the semiconductor substrate. An output electrode is provided so as to come into contact with the first semiconductor layer. The second semiconductor layer is formed by a combination of a first first-conductivity-type semiconductor layer having an impurity concentration distribution in which peak concentration is higher than the impurity concentration of the semiconductor substrate and impurity concentration distribution is reduced at a steep gradient in a direction in which the first first-conductivity-type semiconductor layer is separated from the first semiconductor layer and a second first-conductivity-type semiconductor layer having an impurity concentration distribution in which peak concentration is lower than the peak concentration of the first first-conductivity-type semiconductor layer and impurity concentration distribution is reduced at a gentler gradient than that in the first first-conductivity-type semiconductor layer in the direction in which the second first-conductivity-type semiconductor layer is separated from the first semiconductor layer.

In the semiconductor device according to the above-mentioned aspect of the invention, one of or both of the first first-conductivity-type semiconductor layer and the second first-conductivity-type semiconductor layer may include a hydrogen-related donor.

In the semiconductor device according to the above-mentioned aspect of the invention, the surface layer of the rear surface of the semiconductor substrate may be in a region in which the doping concentration of the second first-conductivity-type semiconductor layer is equal to or higher than the doping concentration of the semiconductor substrate in a depth direction of the semiconductor substrate.

In the semiconductor device according to the above-mentioned aspect of the invention, the surface layer of the rear surface of the semiconductor substrate may be in a region in which the doping concentration of the second first-conductivity-type semiconductor layer is equal to or more than 0.1 times the maximum concentration of the second first-conductivity-type semiconductor layer in the depth direction of the semiconductor substrate.

In the semiconductor device according to the above-mentioned aspect of the invention, the surface layer of the rear surface of the semiconductor substrate may be in a region in which the doping concentration of the second first-conductivity-type semiconductor layer is equal to or more than 0.5 times the maximum concentration of the second first-conductivity-type semiconductor layer in the depth direction of the semiconductor substrate.

In the semiconductor device according to the above-mentioned aspect of the invention, the surface layer of the rear surface of the semiconductor substrate may be in a region in which the doping concentration of the first first-conductivity-type semiconductor layer is equal to or higher than the doping concentration of the semiconductor substrate in the depth direction of the semiconductor substrate.

In the semiconductor device according to the above-mentioned aspect of the invention, the surface layer of the rear surface of the semiconductor substrate may be in a region in which the doping concentration of the first first-conductivity-type semiconductor layer is equal to or more than 0.1 times the maximum concentration of the first first-conductivity-type semiconductor layer in the depth direction of the semiconductor substrate.

In the semiconductor device according to the above-mentioned aspect of the invention, the surface layer of the rear surface of the semiconductor substrate may be in a region in which the doping concentration of the first first-conductivity-type semiconductor layer is equal to or more than 0.5 times the maximum concentration of the first first-conductivity-type semiconductor layer in the depth direction of the semiconductor substrate.

In the semiconductor device according to the above-mentioned aspect of the invention, a peak position of the impurity concentration of the first first-conductivity-type semiconductor layer may be the same as a peak position of the second first-conductivity-type semiconductor layer in the depth direction of the semiconductor substrate.

In the semiconductor device according to the above-mentioned aspect of the invention, the first first-conductivity-type semiconductor layer and the second first-conductivity-type semiconductor layer may be provided such that a peak position in the impurity concentration distribution is a boundary between the first semiconductor layer and the output electrode.

In the semiconductor device according to the above-mentioned aspect of the invention, at least one or more first-conductivity-type semiconductor layers with an impurity concentration distribution in which a peak position is the same as that of the first first-conductivity-type semiconductor layer in the depth direction of the semiconductor substrate and impurity concentration of the peak position is lower than that of the first first-conductivity-type semiconductor layer and is higher than that of the second first-conductivity-type semiconductor layer may be provided between the first first-conductivity-type semiconductor layer and the second first-conductivity-type semiconductor layer.

The semiconductor device according to the above-mentioned aspect of the invention may further have the following characteristics. A second-conductivity-type semiconductor region is selectively provided in a surface layer of a front surface of the semiconductor substrate. A first-conductivity-type semiconductor region is selectively provided in the second-conductivity-type semiconductor region. An input electrode is provided so as to come into contact with the second-conductivity-type semiconductor region and the first-conductivity-type semiconductor region. A control electrode is provided on a surface of a portion of the second-conductivity-type semiconductor region which is interposed between the semiconductor substrate and the first-conductivity-type semiconductor region, with an insulating film interposed therebetween. The first semiconductor layer of a second conductivity type is provided.

The semiconductor device according to the above-mentioned aspect of the invention may further have the following characteristics. A second-conductivity-type semiconductor region is selectively provided in a surface layer of a front surface of the semiconductor substrate. An input electrode is provided so as to come into contact with the second-conductivity-type semiconductor region. The first semiconductor layer of the first conductivity type is provided.

According to the above-mentioned aspects of the invention, two or more proton irradiation processes which have the same projected range and different acceleration energy levels can be performed to form two or more first-conductivity-type semiconductor layers with impurity concentration distributions in which the peak positions of the impurity concentration are the same in the depth direction of the semiconductor substrate and the impurity concentration is reduced at a gentle gradient in the direction in which the first-conductivity-type semiconductor layer is separated from the first semiconductor layer as the impurity concentration of the peak position is lower. Therefore, the first-conductivity-type semiconductor layer with few defects can be formed in a deep portion, which is arranged on the second-conductivity-type semiconductor region side from the rear surface of the semiconductor substrate, by the proton irradiation process with a lower acceleration energy level among two or more proton irradiation processes. Thus, it is possible to suppress a reduction in lifetime while providing a donor layer obtained by changing the defects formed by the proton irradiation into donors. As a result, it is possible to suppress an increase in the switching speed due to a significant reduction in lifetime when the semiconductor device is turned off.

According to the above-mentioned aspects of the invention, since the first-conductivity-type semiconductor layer with few defects is formed in the deep portion, which is arranged on the second-conductivity-type semiconductor region side from the rear surface of the semiconductor substrate, it is possible to reduce a leakage current when a reverse bias is applied. In addition, the first-conductivity-type semiconductor layer with the impurity concentration distribution in which impurity concentration is reduced at a gentle gradient can be formed in the deep portion which is arranged on the second-conductivity-type semiconductor region side from the rear surface of the semiconductor substrate. Therefore, it is possible to suppress oscillation during switching.

According to the semiconductor device and the semiconductor device manufacturing method of the invention, it is possible to reduce the leakage current. In addition, according to the semiconductor device and the semiconductor device manufacturing method of the invention, it is possible to improve the breakdown voltage.

BRIEF DESCRIPTION OF THE DRAWINGS

FIG. 7-1 is a characteristic diagram illustrating the impurity concentration distribution along the cutting line A1-A2 of FIG. 5;

FIG. 7-2 is a characteristic diagram illustrating the impurity concentration distribution of the semiconductor device according to Embodiment 1;

DETAILED DESCRIPTION

Figure 1:
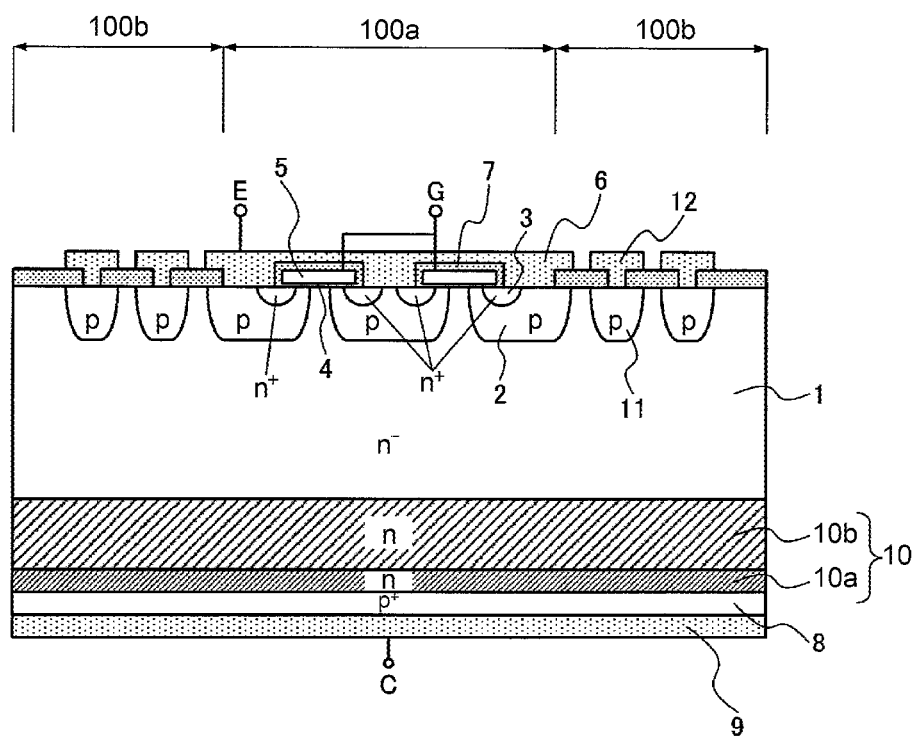
FIG. 1 is a cross-sectional view illustrating the cross-sectional structure of a semiconductor device according to Embodiment 1.

Hereinafter, preferred embodiments of a semiconductor device and a semiconductor device manufacturing method according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In addition, the term "impurity concentration" means net doping concentration by donors and acceptors which are electrically activated in a semiconductor unless otherwise noted.

Embodiment 1

Figure 2:
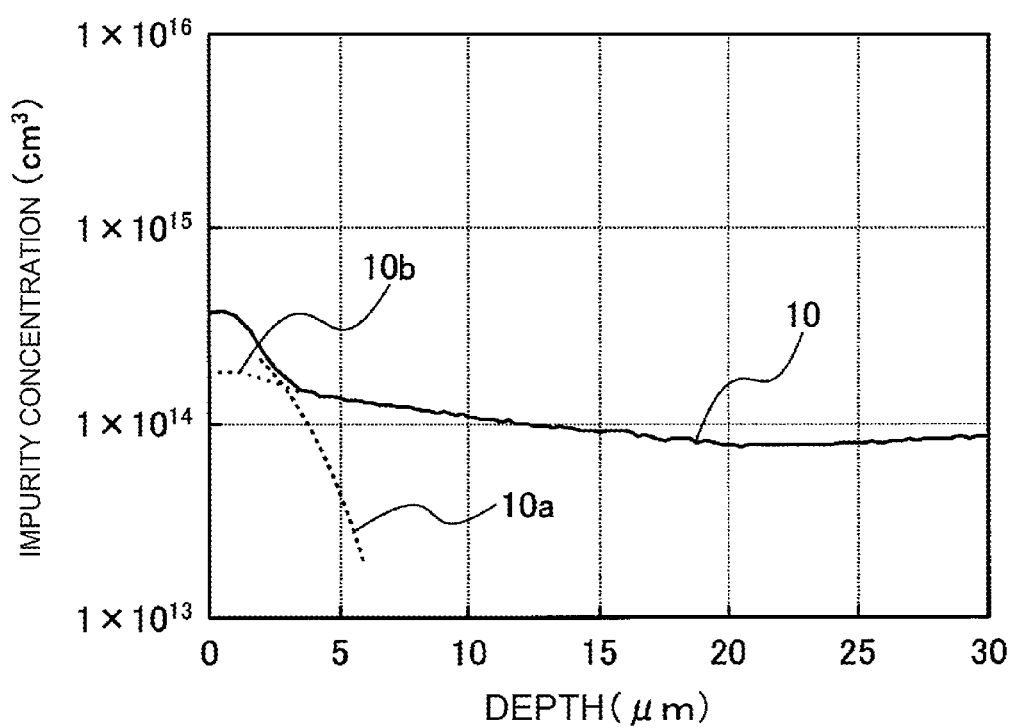
FIG. 2 is a characteristic diagram illustrating an impurity concentration distribution of a field stop layer of the semiconductor device illustrated in FIG. 1.

The cross-sectional structure of a planar gate IGBT, which is an example of a semiconductor device according to Embodiment 1, will be described. FIG. 1 is a cross-sectional view illustrating the cross-sectional structure of the semiconductor device according to Embodiment 1. FIG. 2 is a characteristic diagram illustrating an impurity concentration distribution of a field stop layer of the semiconductor device illustrated in FIG. 1. In FIG. 2, a depth of 0 µm indicates the boundary between a $p^+$ collector layer 8 and an n-type field stop layer 10. The semiconductor device according to Embodiment 1 illustrated in FIG. 1 includes an active region 100a in which a current flows when the semiconductor device is turned on and an edge termination structure region 100b which surrounds the active region 100a, reduces the electric field on the front surface side of an $n^−$ drift region 1, and holds a breakdown voltage.

In the active region 100a, a p base region 2 is provided in a surface layer of the front surface of a semiconductor substrate which will be the $n^−$ drift region 1. An $n^+$ emitter region 3 is selectively provided in the p base region 2 so as to be exposed from the front surface of the semiconductor substrate. A gate electrode 5 is provided on the surface of a portion of the p base region 2 which is interposed between the $n^−$ drift region 1 and the $n^+$ emitter region 3, with a gate oxide film 4 interposed therebetween. An emitter electrode 6 comes into contact with the $n^+$ emitter region 3 and the p base region 2 which are provided in the front surface of the semiconductor substrate. The emitter electrode 6 is electrically insulated from the gate electrode 5 by an interlayer insulating film 7.

In the edge termination structure region 100b, a field limiting ring (FLR) 11, which is a floating p-type region, is provided in the surface layer of the front surface of the semiconductor substrate which will be the n⁻ drift region 1. A field plate (FP) 12 is provided on the front surface of the semiconductor substrate so as to come into contact with the FLR 11. In addition, the p⁺ collector layer 8 is provided in a surface layer of the rear surface of the semiconductor substrate, which will be the n⁻ drift region 1, so as to extend from the active region 100a to the edge termination structure region 100b. The collector electrode 9 is provided on the rear surface of the semiconductor substrate so as to come into contact with the p⁺ collector layer 8.

The n-type field stop layer 10 is provided in the n⁻ drift region 1 so as to come into contact with the p⁺ collector layer 8. The impurity concentration of the n-type field stop layer 10 is higher than that of the n⁻ drift region 1. The n-type field stop layer 10 includes first and second n-type field stop layers 10a and 10b. It is preferable that the first and second n-type field stop layers 10a and 10b each have an impurity concentration distribution in which the peak position of impurity concentration is the boundary between the p⁺ collector layer 8 and the collector electrode 9, that is, the rear surface of the semiconductor substrate after the semiconductor device is completed. When a proton (H⁺) is radiated to the rear surface of a semiconductor wafer and an annealing process is performed, a composite defect of the radiated hydrogen atom and a peripheral vacancy is formed and is changed into a donor to generate a hydrogen-related donor. The n-type field stop layer 10 is formed using the hydrogen-related donor, which will be described below.

The first n-type field stop layer 10a has an impurity concentration distribution in which impurity concentration is reduced toward the n⁺ emitter region 3 at a steeper gradient than that in the second n-type field stop layer 10b and the impurity concentration of a peak position is higher than that in the impurity concentration distribution of the second n-type field stop layer 10b. The second n-type field stop layer 10b has an impurity concentration distribution in which impurity concentration is reduced toward the n⁺ emitter region 3 at a gentler gradient than that in the first n-type field stop layer 10a and the impurity concentration of a peak position is lower than that in the impurity concentration distribution of the first n-type field stop layer 10a. A plurality of n-type field stop layers with an impurity concentration distribution in which the impurity concentration of a peak position is about intermediate between the impurity concentration of the first n-type field stop layer 10a and the impurity concentration of the second n-type field stop layer 10b may be provided between the first n-type field stop layer 10a and the second n-type field stop layer 10b.

Specifically, as illustrated in FIG. 2, the first n-type field stop layer 10a has a higher impurity concentration than the second n-type field stop layer 10b and is provided in a portion of the n⁻ drift region 1 that is shallower than the second n-type field stop layer 10b from the boundary with the p⁺ collector layer 8. The depth of the first n-type field stop layer 10a from the boundary with the p⁺ collector layer 8 may be in the range of, for example, 5 μm to 10 μm. The second n-type field stop layer 10b is provided in a portion of the n⁻ drift region 1 that is deeper than the first n-type field stop layer 10a from the boundary with the p⁺ collector layer 8. The depth of the second n-type field stop layer 10b from the boundary with the p⁺ collector layer 8 may be, for example, 30 μm.

As such, the n-type field stop layer 10 includes the first and second n-type field stop layers 10a and 10b with different impurity concentration distributions in which the impurity concentrations of the peak position are different from each other and are reduced toward the n⁺ emitter region 3 at different gradients. In this way, the n-type field stop layer 10 is formed which has an impurity concentration distribution in which impurity concentration at a predetermined depth from the boundary with the p⁺ collector layer 8 is higher than that in Conventional Example 1 represented by a dotted line in FIG. 7-1, which will be described below, and impurity concentration in a region of the semiconductor substrate that is deeper than the p⁺ collector layer 8 is lower than that in Conventional Example 1. Conventional Example 1 is a semiconductor device including one n-type field stop layer 41 which is formed by one proton irradiation operation such that the breakdown voltage is equal to that of the semiconductor device according to Embodiment 1.

Figure 3:
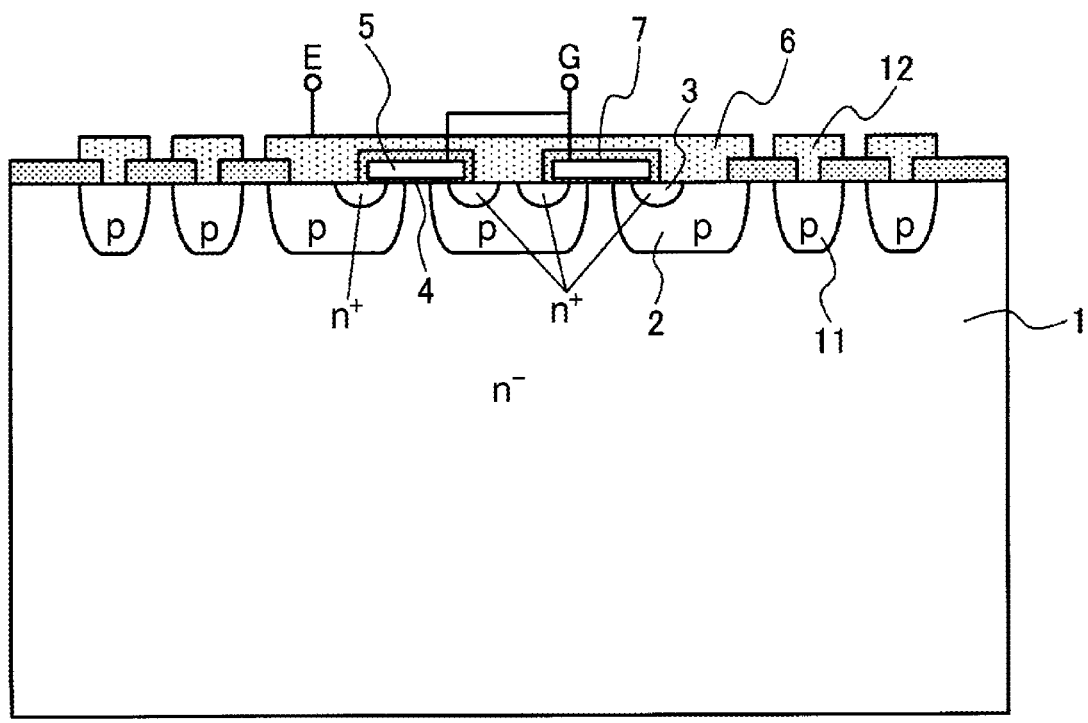
FIG. 3 is a cross-sectional view illustrating the cross-sectional structure of the semiconductor device according to Embodiment 1 which is being manufactured.
Figure 6:
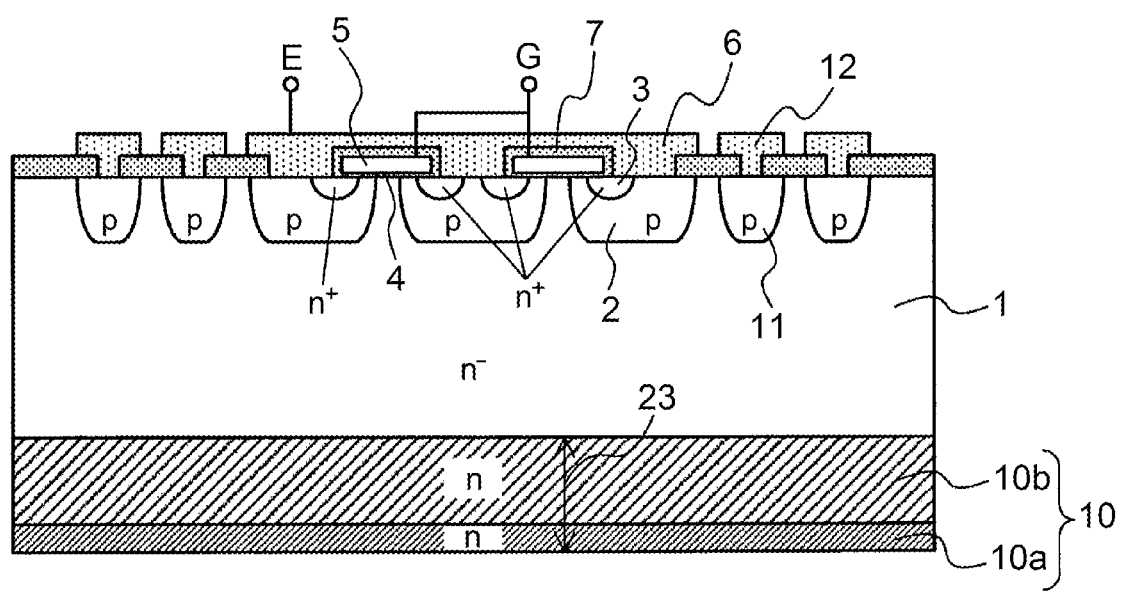
FIG. 6 is a cross-sectional view illustrating the cross-sectional structure of the semiconductor device according to Embodiment 1 which is being manufactured.
Figures 1, 7:
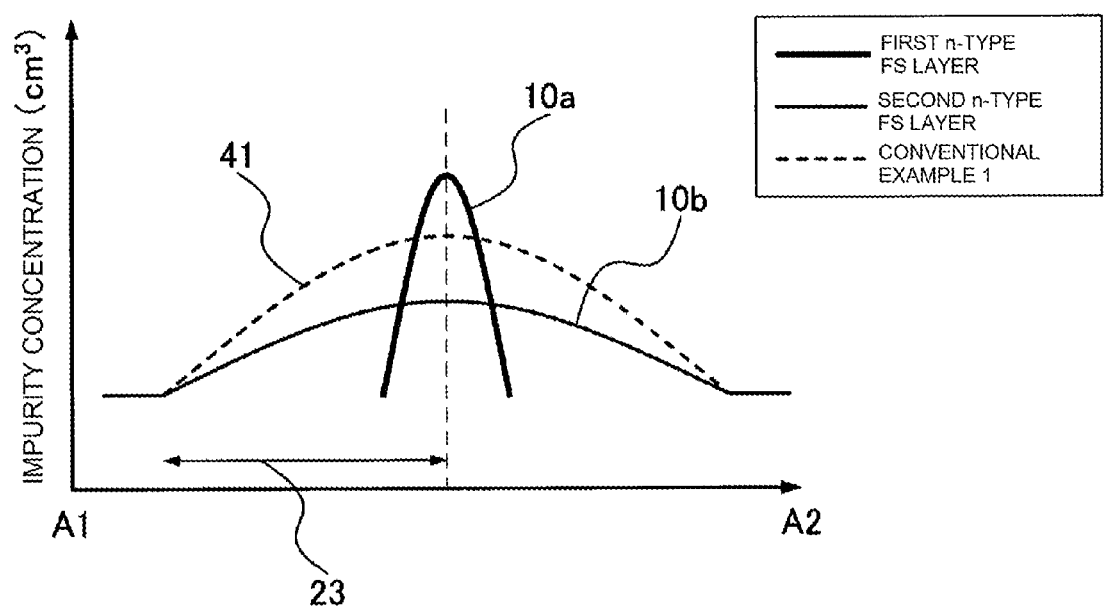
Figures 2, 7:
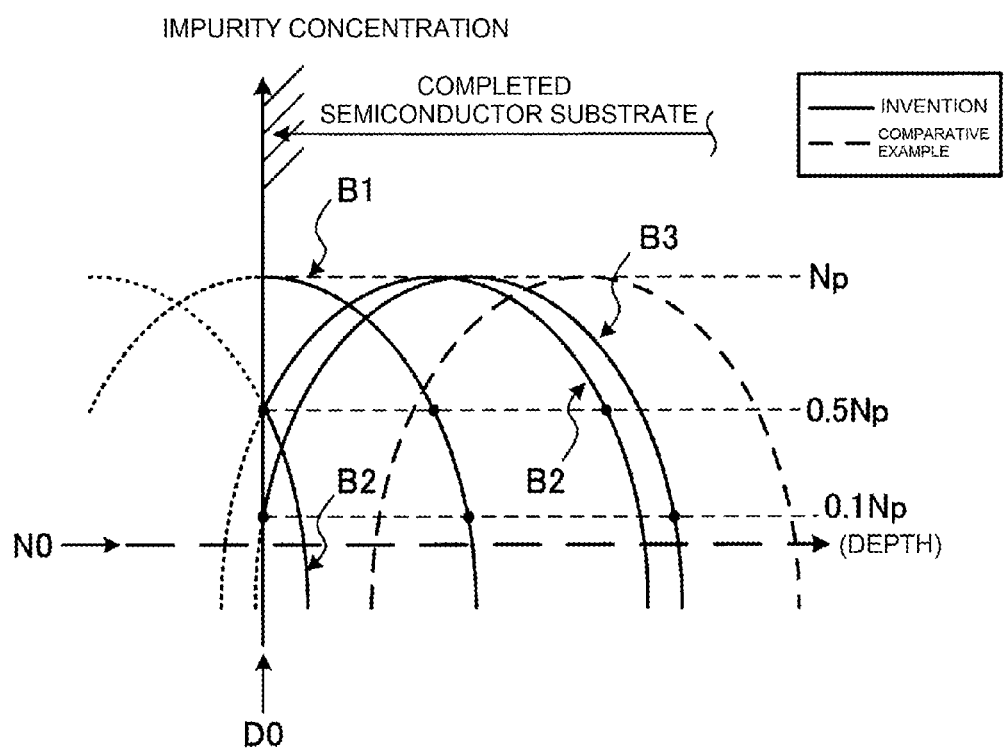

Next, a method for manufacturing the semiconductor device according to Embodiment 1 illustrated in FIG. 1 will be described. FIGS. 3 to 6 are cross-sectional views illustrating the cross-sectional structure of the semiconductor device according to Embodiment 1 which is being manufactured. FIG. 7-1 is a characteristic diagram illustrating an impurity concentration distribution along the cutting line A1-A2 of FIG. 5. An example in which the first and second n-type field stop layers 10a and 10b are formed so as to have the same peak position in the impurity concentration distribution will be described. First, as illustrated in FIG. 3, a MOS structure including the p base region 2, the n⁺ emitter region 3, the gate oxide film 4, and the gate electrode 5 is formed on the front surface of the semiconductor substrate which will be the n⁻ drift region 1. Then, the emitter electrode 6 is formed so as to come into contact with the p base region 2 and the n⁺ emitter region 3.

Figure 4:
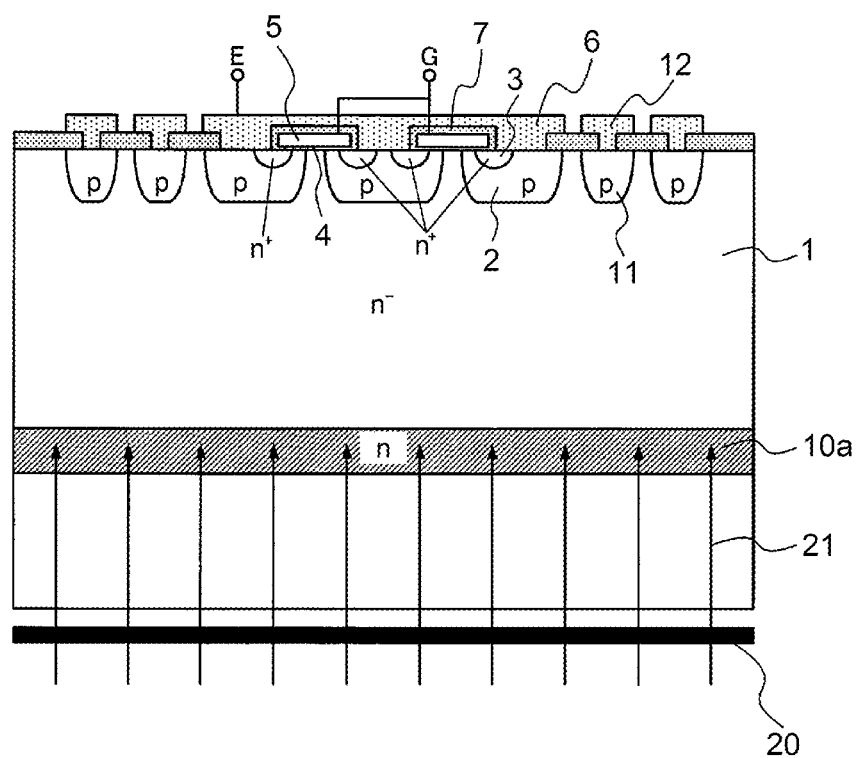
FIG. 4 is a cross-sectional view illustrating the cross-sectional structure of the semiconductor device according to Embodiment 1 which is being manufactured.

Then, as illustrated in FIG. 4, an absorber 20 for adjusting the projected range of protons is provided above the rear surface of the semiconductor substrate, with a predetermined gap therebetween. The absorber is a plate member which is made of, for example, aluminum. Then, a first proton irradiation process 21 for forming the first n-type field stop layer 10a is performed for the entire rear surface of the semiconductor substrate in a projected range Rp which is adjusted by the absorber 20. The projected range Rp of the first proton irradiation process 21 is adjusted to a position which will be a thinned rear surface of the semiconductor substrate, depending on the thickness of the absorber 20. In the first proton irradiation process 21, for example, acceleration energy may be 2 MeV and a dose may be $1 \times 10^{13}/\text{cm}^2$. It has been known that the acceleration energy is adjusted by the acceleration voltage of a cyclotron or a linear accelerator for proton irradiation.

Figure 5:
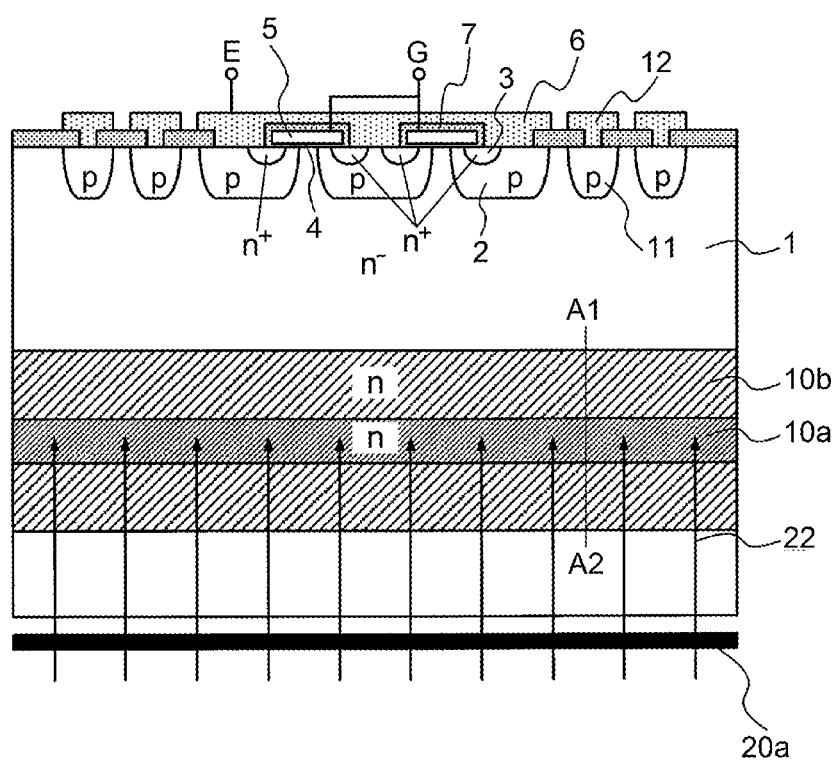
FIG. 5 is a cross-sectional view illustrating the cross-sectional structure of the semiconductor device according to Embodiment 1 which is being manufactured.

Then, as illustrated in FIG. 5, a second proton irradiation process 22 for forming the second n-type field stop layer 10b is performed on the entire rear surface of the semiconductor substrate through an absorber 20a with a different thickness from that used in the first proton irradiation process 21. The projected range of the second proton irradiation process 22 is adjusted by the absorber 20a so as to be equal to the projected range Rp of the first proton irradiation process 21. The acceleration energy of the second proton irradiation process 22 is more than the acceleration energy of the first proton irradiation process 21. Therefore, when the absorber 20 of the first proton irradiation process 21 is used, the projected range of protons in the semiconductor substrate in the second proton irradiation process 22 is greater than the projected range Rp of the first proton irradiation process 21. In order to equalize the projected range of the second proton irradiation process 22 to the projected range Rp of the first proton irradiation process 21, the thickness of the absorber 20a used in the second proton irradiation process 22 needs to be greater than that of the absorber 20 used in the first proton irradiation process 21. In the second proton irradiation process 22, for example, acceleration energy may be 8 MeV and a dose may be $1\times10^{13}/cm^2$. In each proton irradiation process, for example, the acceleration energy may be changed in the range of 1 MeV to 20 MeV, preferably, in the range of 2 MeV to 8 MeV. Then, annealing is performed to change (activate) the crystal defects formed by the first and second proton irradiation processes 21 and 22 into donors. The annealing may be performed for each proton irradiation process or it may be performed only after at least the last proton irradiation process. The annealing may be performed at a temperature of, for example, 300° C. to 500° C. for 1 to 10 hours.

After the crystal defects are changed into the donors, the first and second n-type field stop layers 10a and 10b that have the position of the rear surface of the semiconductor substrate, which will be thinned in the subsequent process, as the peak position of impurity concentration are formed with a predetermined half width in the semiconductor substrate. The impurity concentration distributions of the first and second n-type field stop layers 10a and 10b after the change to the donors will be described below. Then, as illustrated in FIG. 6, the rear surface of the semiconductor substrate is ground such that only an n-type layer 23, which extends from the peak position of impurity concentration to the boundary with a portion of the $n^-$ drift region 1 that is close to the $n^+$ emitter region 3, in the n-type layer formed by the first and second proton irradiation processes 21 and 22 remains as the n-type field stop layer 10. Then, the $p^+$ collector layer 8, which is a connection portion with the collector electrode 9, and the collector electrode 9 which comes into contact with the $p^+$ collector layer 8 are formed on the rear surface of the semiconductor substrate by a general method. In this way, the planar gate IGBT illustrated in FIG. 1 is completed.

In the above-mentioned semiconductor device manufacturing method, when the first and second n-type field stop layers 10a and 10b which have different peak positions in the impurity concentration distribution are formed, the thickness of the absorber 20 and the absorber 20a is appropriately adjusted. In addition, when the first and second n-type field stop layers 10a and 10b which have different peak positions in the impurity concentration distribution are formed, the rear surface of the semiconductor substrate after the change to the donors is ground such that the first n-type field stop layer 10a or the second n-type field stop layer 10b and the surface layer ($p^+$ collector layer 8) of the rear surface of the semiconductor substrate satisfy the following positional relationship.

As illustrated in FIG. 7-1, the first n-type field stop layer 10a formed by the first proton irradiation process 21 and the second n-type field stop layer 10b formed by the second proton irradiation process 22 are formed in the semiconductor substrate after the change to the donors such that the peak positions in the impurity concentration distributions overlap each other. In the impurity concentration distribution of the first n-type field stop layer 10a, the peak position is high, the rate of decrease in impurity concentration from the peak position is high, and the half width is narrow. In the impurity concentration distribution of the second n-type field stop layer 10b, the peak position is low, the rate of decrease in impurity concentration from the peak position is low, and the half width is wide. Therefore, since the n-type layer 23 which extends from the peak position of the impurity concentration to the end close to the $n^+$ emitter region 3 remains as the n-type field stop layer 10, it is possible to obtain the n-type field stop layer 10 with the desired impurity concentration distribution illustrated in FIG. 2.

FIG. 7-2 is a characteristic diagram illustrating the impurity concentration distribution of the semiconductor device according to Embodiment 1. FIG. 7-2 illustrates the positional relationship between the first n-type field stop layer 10a or the second n-type field stop layer 10b and the surface layer of the rear surface of the semiconductor substrate in the invention. The vertical direction indicates impurity concentration (a position represented by N0 indicates the concentration of the substrate) and the horizontal direction indicates the depth from the rear surface D0 of the semiconductor substrate after the semiconductor device is completed. The rear surface D0 of the semiconductor substrate after the semiconductor device is completed indicates the position of the rear surface of the semiconductor substrate, which is polished and thinned during a process, in the completed semiconductor device. In addition, a portion on the left side of the rear surface D0 of the semiconductor substrate after the semiconductor device is completed is a portion of the semiconductor substrate which is removed by polishing during a process. A $p^+$ collector layer (not illustrated) is formed in a surface layer of the rear surface D0 of the semiconductor substrate after the semiconductor device is completed (hereinafter, referred to as a surface layer of the rear surface of the semiconductor substrate).

When the surface layer of the rear surface of the semiconductor substrate ($p^+$ collector layer) is within the range of the first n-type field stop layer 10a or the second n-type field stop layer 10b, that is, a region with a higher concentration than the semiconductor substrate, it is possible to obtain the effect of the invention. Preferably, as represented by reference numeral B3, the surface layer of the rear surface of the semiconductor substrate is within a region with impurity concentration that is equal to or more than 0.1 times the peak concentration (the maximum concentration) Np of each field stop layer. More preferably, as represented by reference numeral B2, the surface layer of the rear surface of the semiconductor substrate is within a region with impurity concentration that is equal to or more than 0.5 times the peak concentration (the maximum concentration) Np of each field stop layer. Reference numeral B1 indicates a case in which the rear surface D0 of the semiconductor substrate after the semiconductor device is completed has impurity concentration that is equal to the peak concentration Np of each field stop layer. As a comparative example, a case in which the surface layer of the rear surface of the semiconductor substrate after the semiconductor device is completed is within a region with a lower concentration than the semiconductor substrate is represented by a coarse dotted line. When the substrate concentration N0 is higher than 0.1 Np or 0.5 Np, the surface layer of the rear surface of the semiconductor substrate is preferably in the region with a higher concentration than the semiconductor substrate.

The first and second proton irradiation processes 21 and 22 may be reversed. That is, the first proton irradiation process 21 may be performed after the second proton irradiation process 22. The first and second proton irradiation processes 21 and 22 may be performed for the front surface of the semiconductor substrate. When the first and second proton irradiation processes 21 and 22 are performed for the front surface of the semiconductor substrate, it is easy to adjust the projected range Rp of the first and second proton irradiation processes 21 and 22. In addition, for the acceleration energy of the first and second proton irradiation processes 21 and 22, as described above, the acceleration energy of the second proton irradiation process 22 may be more than that of the first proton irradiation process 21. For example, the acceleration energy can be changed in the range of 1 MeV to 10 MeV. In the first and second proton irradiation processes 21 and 22, a dose can be changed in the range of $1\times10^{12}/cm^2$ to $1\times10^{15}/cm^2$.

As described above, according to Embodiment 1, the first and second proton irradiation processes with the same projected range Rp and different acceleration energy levels can be performed to form the first and second n-type field stop layers which have the same peak position of impurity concentration in the depth direction of the semiconductor substrate and have different impurity concentrations at the peak position and different impurity concentration distributions. Therefore, the second proton irradiation process can be performed with acceleration energy less than that of the first proton irradiation process to form the second n-type field stop layer without a defect in a deep portion which is arranged on the $n^+$ emitter region side from the rear surface of the semiconductor substrate. Thus, it is possible to suppress a reduction in lifetime while providing a donor region in which the defect caused by proton irradiation is changed into a donor. As a result, it is possible to suppress an increase in the switching speed due to a significant reduction in lifetime when the semiconductor device is turned off.

Since the second n-type field stop layer with few defects is formed in the deep portion which is arranged on the $n^+$ emitter region side from the rear surface of the semiconductor substrate, it is possible to reduce the amount of leakage current when a reverse bias is applied. In addition, it is possible to form the second n-type field stop layer with an impurity concentration distribution, in which impurity concentration is reduced toward the $n^+$ emitter region at a gentle gradient, in the deep portion which is arranged on the $n^+$ emitter region side from the rear surface of the semiconductor substrate. Therefore, it is possible to suppress oscillation during switching.

According to Embodiment 1, the first proton irradiation process can be performed with acceleration energy more than that of the second proton irradiation process to form the first n-type field stop layer with a higher impurity concentration than the second n-type field stop layer in a portion of the n-type field stop layer which comes into contact with the collector layer. Therefore, the second n-type field stop layer has an impurity concentration distribution in which impurity concentration is reduced toward the $n^+$ emitter region at a gentle gradient, which makes it possible to smoothly prevent the expansion of the depletion layer which is spread from the pn junction between the p base region and the $n^-$ drift region during switching. The first n-type field stop layer has a higher impurity concentration than the second n-type field stop layer, which makes it possible to prevent the depletion layer from reaching the $p^+$ collector layer.

Embodiment 2

Figure 8:
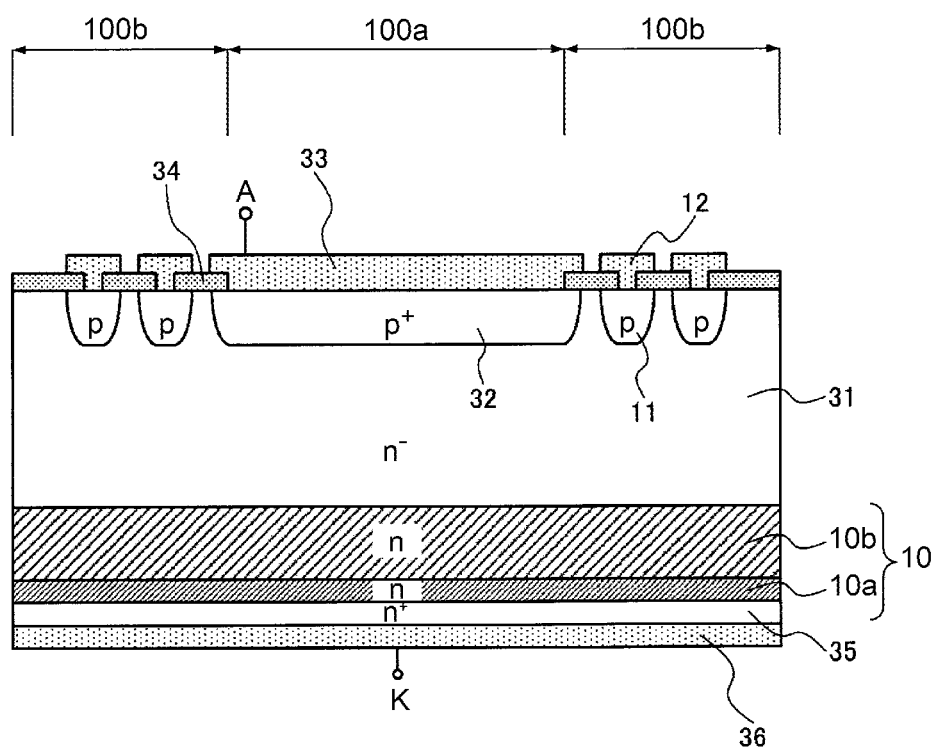
FIG. 8 is a cross-sectional view illustrating the cross-sectional structure of a semiconductor device according to Embodiment 2.

FIG. 8 is a cross-sectional view illustrating the cross-sectional structure of a semiconductor device according to Embodiment 2. The semiconductor device according to Embodiment 2 differs from the semiconductor device according to Embodiment 1 in that it is a diode instead of the IGBT.

As illustrated in FIG. 8, in an active region 100a, a $p^+$ anode region 32 is selectively provided in a surface layer of a front surface of an $n^-$ semiconductor substrate 31. An anode electrode 33 comes into contact with the $p^+$ anode region 32. Reference numeral 34 is an interlayer insulating film. An $n^+$ cathode layer 35 is provided in a surface layer of a rear surface of the $n^-$ semiconductor substrate 31 and an n-type field stop layer 10 is provided in a region that is deeper than the $n^+$ cathode layer 35 from the rear surface.

Similarly to Embodiment 1, the n-type field stop layer 10 includes first and second n-type field stop layers 10a and 10b. A cathode electrode 36 comes into contact with the $n^+$ cathode layer 35. A method for manufacturing the semiconductor device according to Embodiment 2 is the same as the method for manufacturing the semiconductor device according to Embodiment 1 except for the element structure of the diode formed by a general method.

As described above, according to Embodiment 2, it is possible to obtain the same effect as that in Embodiment 1. In addition, according to Embodiment 2, when the first and second n-type field stop layers 10a and 10b are provided in the diode, it is possible to suppress a reduction in carrier concentration in the vicinity of the cathode layer. Therefore, it is possible to suppress hard recovery due to the noise of the diode and to obtain a high breakdown voltage.

Example 1

Figure 9:
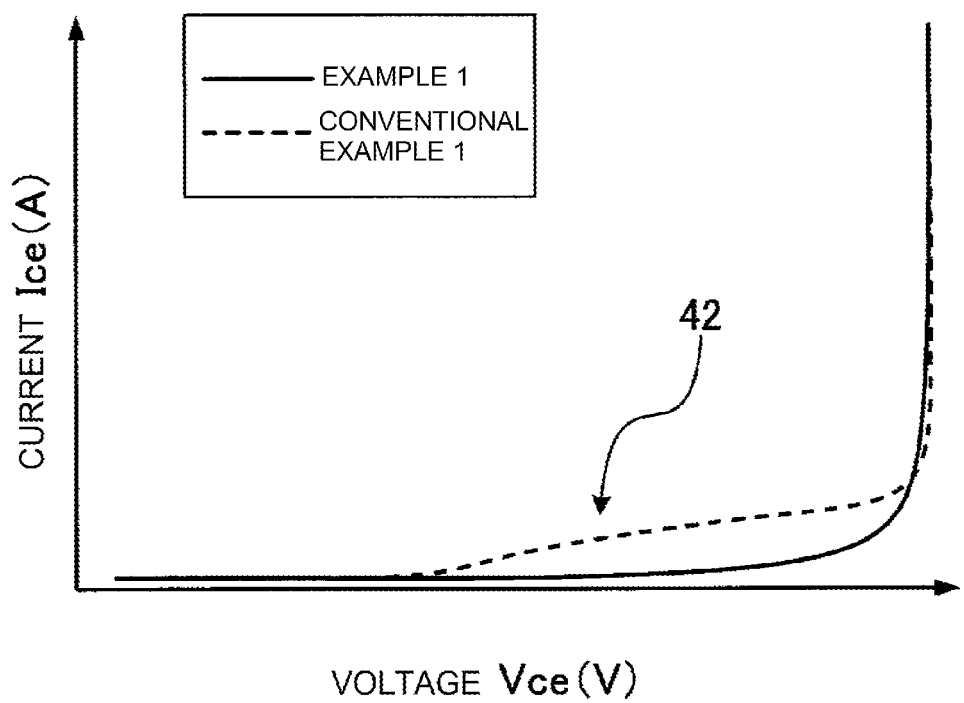
FIG. 9 is a characteristic diagram illustrating the electrical characteristics of a semiconductor device according to Example 1.

FIG. 9 is a characteristic diagram illustrating the electrical characteristics of the semiconductor device according to Example 1. FIG. 9 illustrates the waveform of a leakage current when a reverse bias is applied. An IGBT (hereinafter, referred to as Example 1) including the first and second n-type field stop layers 10a and 10b was manufactured by the semiconductor device manufacturing method according to Embodiment 1. For comparison, Conventional Example 1 represented by the dotted line in FIG. 7-1, in which one n-type field stop layer was formed by one proton irradiation process such that the breakdown voltage was equal to that in Example 1, was manufactured. Then, in Example 1 and Conventional Example 1, a leakage current was measured when the reverse bias was applied.

As illustrated in FIG. 9, in Conventional Example 1, it was verified that, since the region, which extended from the rear surface of the semiconductor substrate to the deep region on the emitter region side and had a large number of defects, was formed by one proton irradiation process, the leakage current increased due to a diffusion current that was caused by the defects in an early stage when a forward current increased (a portion represented by reference numeral 42). Conventional Example 1 has a high risk of thermal runaway during a high-temperature operation. In contrast, in Example 1, it was verified that, since the second n-type field stop layer 10b with few defects was provided in the deep region that was arranged on the emitter region side from the rear surface of the semiconductor substrate, it was possible to suppress an increase in leakage current while maintaining the breakdown voltage, as compared to Conventional Example 1.

Example 2

Figure 10:
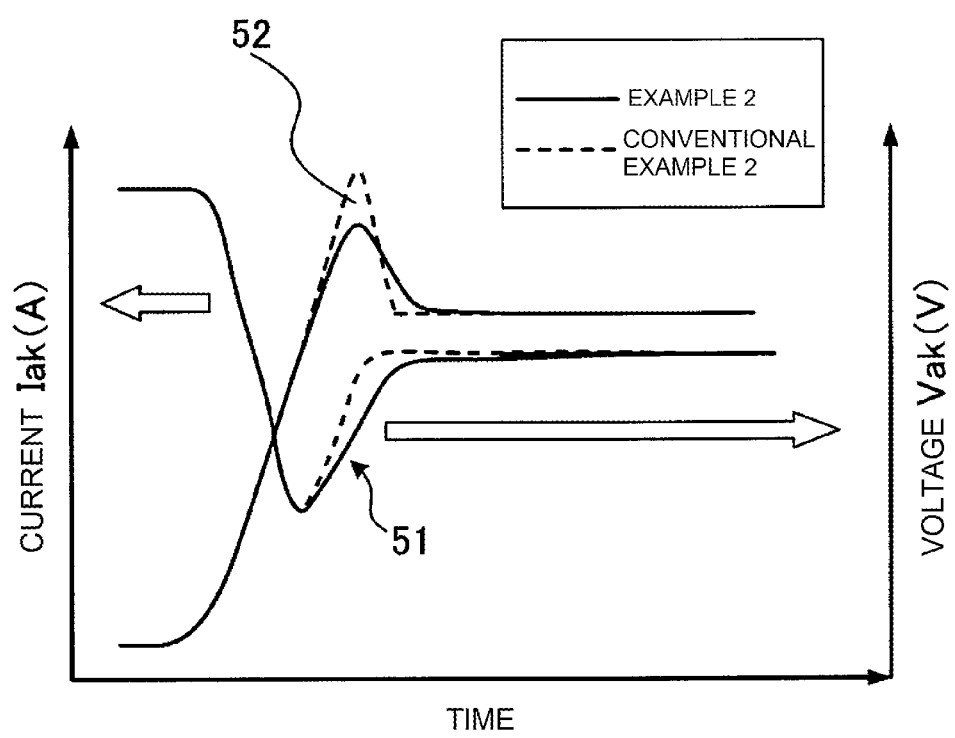
FIG. 10 is a characteristic diagram illustrating the electrical characteristics of a semiconductor device according to Example 2.
Figure 11:
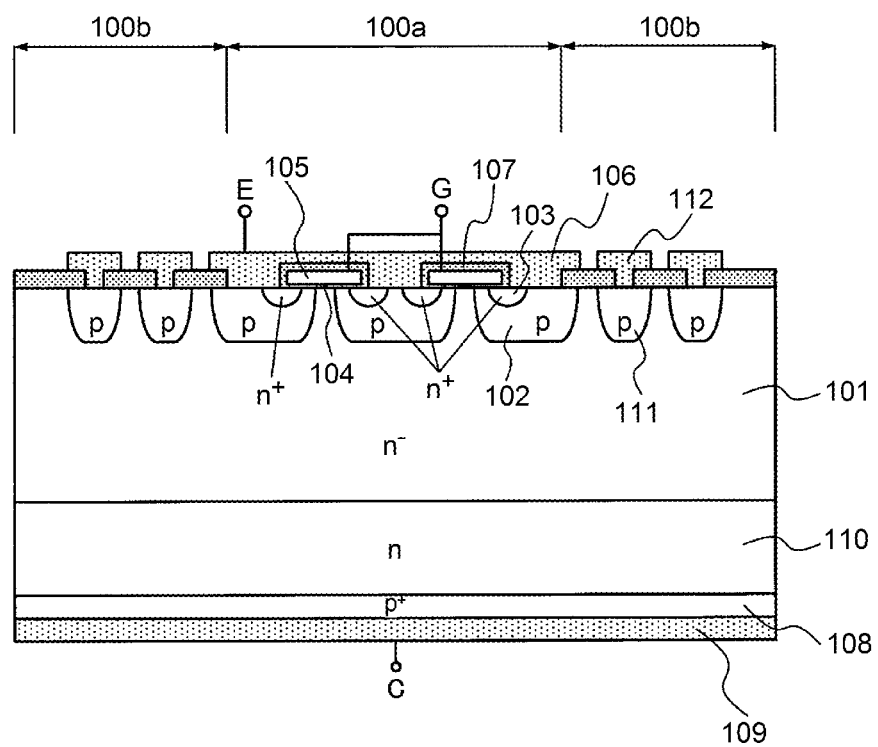
FIG. 11 is a cross-sectional view illustrating the cross-sectional structure of a semiconductor device according to the related art.

FIG. 10 is a characteristic diagram illustrating the electrical characteristics of a semiconductor device according to Example 2. FIG. 10 illustrates the reverse recovery waveform of a free wheeling diode (FWD). An FWD (hereinafter, referred to as Example 2) including first and second n-type field stop layers 10a and 10b was manufactured by the semiconductor device manufacturing method according to Embodiment 2. For comparison, Conventional Example 2, in which one n-type field stop layer was formed by one proton irradiation process such that the breakdown voltage was equal to that in Example 2, was manufactured. Then, in Example 2 and Conventional Example 2, a surge voltage and a reverse current during reverse recovery were measured.

As illustrated in FIG. 10, in Conventional Example 2, it was verified that the region, which extended from the rear surface of the semiconductor substrate to a deep region on the emitter region side and had a large number of defects acting as a lifetime killer, was formed by one proton irradiation process, hard recovery occurred in a variation di/dt in reverse recovery current over time (a portion represented by reference numeral 51) and the surge voltage increased (a portion represented by reference numeral 52). In contrast, in Example 2, it was verified that, since the second n-type field stop layer 10b with few defects was provided in the deep region that was arranged on the anode region side from the rear surface of the semiconductor substrate, it was possible to reduce the number of defects acting as the lifetime killer in the deep region on the anode region side and soft recovery could be achieved.

The invention is not limited to the above-described embodiments, but various changes and modifications of the invention can be made. For example, three or more proton irradiation processes with different acceleration energy levels may be performed to form three or more n-type field stop layers which have the same peak position of impurity concentration and different impurity concentrations at the peak position. In addition, the invention can be applied to various semiconductor devices in which the field stop layer can be provided. In Embodiment 1, the planar gate IGBT is given as an example of the semiconductor device. However, the invention may be applied to, for example, a trench gate IGBT.

INDUSTRIAL APPLICABILITY

As described above, the semiconductor device and the semiconductor device manufacturing method according to the invention are useful for a semiconductor device that is used in a power conversion device, such as a converter or an inverter.

EXPLANATIONS OF LETTERS OR NUMERALS 1 n⁻ DRIFT REGION
2 p BASE REGION
3 n⁺ EMITTER REGION
4 GATE OXIDE FILM
5 GATE ELECTRODE
6 EMITTER ELECTRODE
7 INTERLAYER INSULATING FILM
8 p⁺ COLLECTOR LAYER
9 COLLECTOR ELECTRODE
10 n-TYPE FIELD STOP LAYER
10a FIRST n-TYPE FIELD STOP LAYER
10b SECOND n-TYPE FIELD STOP LAYER
20, 20a ABSORBER
22 SECOND PROTON IRRADIATION
23 n-TYPE SEMICONDUCTOR LAYER EXTENDING FROM PEAK POSITION OF IMPURITY CONCENTRATION TO END OF N⁺ EMITTER REGION 3

The invention claimed is:
1. A semiconductor device, comprising:
a semiconductor substrate of a first-conductivity-type including a drift region and having a front surface and a rear surface;
a first semiconductor layer that is provided in a surface layer of the rear surface of the semiconductor substrate;
a second semiconductor layer of the first-conductivity-type:
(a) that is provided in the semiconductor substrate so as to come into contact with a front surface side of the first semiconductor layer and a rear surface side of the drift region and that has a front surface and a rear surface;
(b) that has a doping concentration that is higher than that of the semiconductor substrate;
(c) that has a first impurity concentration distribution gradient proximate to the front surface side of the first semiconductor layer that has an impurity concentration that decreases from the rear surface of the semiconductor substrate toward the front surface of the semiconductor substrate;
(d) that has a second impurity concentration distribution gradient proximate to the rear surface side of the drift region that has an impurity concentration that decreases from the rear surface of the semiconductor substrate toward the front surface of the semiconductor substrate, and that has a slope that is substantially less than that of the first impurity concentration distribution gradient; and
(e) that contains hydrogen atoms as donors; and
a first electrode that comes into contact with the first semiconductor layer,
wherein the first impurity concentration distribution gradient and the second impurity concentration distribution gradient are connected at a position close to a depth of 3 μm from the front surface side of the first semiconductor layer and configured such that:
(1) an impurity concentration of the second semiconductor layer decreases substantially continuously from the front surface side of the first semiconductor layer to a depth of 20 μm toward the rear surface side of the drift region; and
(2) the second impurity concentration distribution gradient has an absolute value which is less than that of the first impurity concentration distribution gradient, and
wherein an absolute value of the second impurity concentration distribution gradient close to said position is larger than an absolute value of the second impurity concentration distribution gradient close to the depth of 20 μm from the front surface side of the first semiconductor layer.

2. The semiconductor device according to claim 1, wherein one of or both of a region which has the first impurity concentration distribution gradient and a region which has the second impurity concentration distribution gradient includes the hydrogen atoms as donors.

3. The semiconductor device according to claim 1, wherein the rear surface of the semiconductor substrate is positioned in a depth region and the depth region has a hydrogen concentration that is equal to or more than 0.1 times a maximum hydrogen concentration in a depth direction of the semiconductor substrate.

4. The semiconductor device according to claim 1, further comprising:
a second-conductivity-type semiconductor region that is selectively provided in a surface layer of the front surface of the semiconductor substrate;
a first-conductivity-type semiconductor region that is selectively provided in the second-conductivity-type semiconductor region;
a second electrode that comes into contact with the second-conductivity-type semiconductor region and the first-conductivity-type semiconductor region; and a control electrode that is provided on a surface of a portion of the second-conductivity-type semiconductor region which is interposed between the semiconductor substrate and the first-conductivity-type semiconductor region, with an insulating film interposed therebetween, wherein the first semiconductor layer is of the second-conductivity-type.

5. The semiconductor device according to claim 1, wherein the first-conductivity-type is an n-type, and wherein the hydrogen atoms of the second semiconductor layer have a concentration distribution that has a substantial peak in the rear surface of the semiconductor substrate.

6. The semiconductor device according to claim 1, wherein the second semiconductor layer adjoins the drift region.

7. The semiconductor device according to claim 1, wherein the second impurity concentration distribution gradient has a length from a start point to an end point thereof that is longer than that of the first impurity concentration distribution gradient.

8. The semiconductor device according to claim 1, wherein the semiconductor device constitutes a bipolar transistor structure; wherein the first semiconductor layer is of a second-conductivity-type and is a collector layer, and wherein the first electrode is a collector electrode.

9. The semiconductor device according to claim 1, wherein the semiconductor device constitutes a diode structure, wherein the first semiconductor layer is of the first-conductivity-type and is a cathode layer, and wherein the first electrode is a cathode electrode.

* * * * *